United States Patent
Naaman et al.

(10) Patent No.: US 9,369,133 B2
(45) Date of Patent: Jun. 14, 2016

(54) HYBRID QUANTUM CIRCUIT ASSEMBLY

(71) Applicants: Ofer Naaman, Ellicott City, MD (US); Anthony Joseph Przybysz, Highland, MD (US); Rupert M. Lewis, Albuquerque, NM (US); Steven L. Sendelbach, Columbia, MD (US)

(72) Inventors: Ofer Naaman, Ellicott City, MD (US); Anthony Joseph Przybysz, Highland, MD (US); Rupert M. Lewis, Albuquerque, NM (US); Steven L. Sendelbach, Columbia, MD (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 41 days.

(21) Appl. No.: 14/290,457

(22) Filed: May 29, 2014

(65) Prior Publication Data

US 2015/0349780 A1 Dec. 3, 2015

(51) Int. Cl.
*H03K 19/195* (2006.01)
*B82Y 10/00* (2011.01)
*G06N 99/00* (2010.01)

(52) U.S. Cl.
CPC ............ *H03K 19/1958* (2013.01); *B82Y 10/00* (2013.01); *G06N 99/002* (2013.01)

(58) Field of Classification Search
CPC ...... G06N 99/002; B82Y 10/00; H01L 27/18; H01L 39/223; H01L 39/2493; H01L 49/006; H01L 39/025; H03K 3/38; H03K 19/195; H03K 17/92; H03K 19/1952; H03K 19/1958; Y10S 977/933; Y10S 505/846
USPC .................. 326/1–7; 327/366–373, 527–529; 505/162, 164, 170, 204; 361/141
See application file for complete search history.

(56) References Cited

U.S. PATENT DOCUMENTS

| | | | |
|---|---|---|---|
| 7,498,832 B2 | 3/2009 | Baumgardner et al. | |
| 7,714,605 B2 | 5/2010 | Baumgardner et al. | |
| 7,724,020 B2 | 5/2010 | Herr | |
| 7,772,871 B2 | 8/2010 | Herr et al. | |
| 7,772,872 B2 | 8/2010 | Lewis | |
| 7,782,077 B2 | 8/2010 | Herr et al. | |
| 7,786,748 B1* | 8/2010 | Herr ................... | H03K 19/1954 326/3 |
| 2009/0322347 A1 | 12/2009 | Hashimshony et al. | |
| 2013/0015885 A1* | 1/2013 | Naaman ................. | H03K 3/38 327/1 |
| 2014/0314419 A1* | 10/2014 | Paik ....................... | H04B 10/70 398/115 |

FOREIGN PATENT DOCUMENTS

| | | |
|---|---|---|
| JP | H09 257893 A | 10/1997 |
| WO | WO 2010/028183 A2 | 3/2010 |
| WO | WO 2010/028183 A3 | 3/2010 |

OTHER PUBLICATIONS

S Poletto, et. al. "Coherent oscillations in a superconducting tunable flux qubit manipulated without microwaves", New Journal of Physics 11 (2009), Jan. 2009.*

(Continued)

*Primary Examiner* — Alexander H Taningco
*Assistant Examiner* — Seokjin Kim
(74) *Attorney, Agent, or Firm* — Tarolli, Sundheim, Covell & Tummino LLP

(57) ABSTRACT

Systems and methods are provided for a hybrid qubit circuit assembly is provided. A first plural set of Josephson junctions is arranged in series on a first path between two nodes of a circuit. A second plural set of Josephson junctions is arranged in parallel with one another to form a direct current superconducting quantum interference device (DC SQUID). The DC SQUID is in parallel with the first plural set of Josephson junctions. A capacitor is in parallel with each of the first plural set of Josephson junctions and the DC SQUID.

22 Claims, 5 Drawing Sheets

(56) References Cited

OTHER PUBLICATIONS

X. Zhu, et. al. "Coherent operation of a gap-tunable flux qubit", Applied Physics Letters 97, Sep. 2010.*
F. Chiarello, et. al. "Superconducting qubit manipulated by fast pulses: experimental observation of distinct decoherence regimes", New Journal of Physics, 14 (2012), Feb. 14, 2012.*
Barends, et al.: "*Coherent Josephson Qubit Suitable for Scalable Quantum Integrated Circuits*", Phys. Rev. Lett. 111, 080502 (2013); DOI: 10.1103/PhysRevLett.111.080502; found online at http://arxiv.org/pdf/1304.2322.pdf, Apr. 9, 2013, pp. 1-6 and Supplementary Material for same, pp. 1-4.
Brito, et al.: "*Efficient One- and Two-Qubit Pulsed Gates for an Oscillator Stabilized Josephson Qubit*"; New J. Phys. 10 (2008) 033027; DOI: 10.1088/1367-2630/10/3/033027; found online at http://arxiv.org/pdf/0709.1478.pdf, Sep. 10, 2007, pp. 1-36.
Chiarello, et al.: "*Superconducting Qubit Manipulated by Fast Pulses: Experimental Observation of Distinct Decoherence Regimes*"; New J. Phys. 14 (2012) 023031; found online at http://arxiv.org/pdf/1110.1508v1.pdf, Oct. 7, 2011, pp. 1-16.
Chiorescu, et al.: "*Coherent Quantum Dynamics of a Superconducting Flux Qubit*"; Science, vol. 299, p. 1869 (2003); DOI: 10.1126/science.1081045; found online at http://arxiv.org/pdf/condmat/0305461.pdf, submitted Dec. 2, 2002, accepted Feb. 4, 2003, pp. 1-5.
Fedorov, et al.: "*Reading-Out the State of a Flux Qubit by Josephson Transmission Line Solutions*"; Phys. Rev. B 75, 224504 (2007); DOI: 10.1103/PhysRevB.75.224504; found online at http://arxiv.org/pdf/cond-mat/0611680.pdf?origin=publication_detail, submitted Nov. 27, 2006, last revised Nov. 30, 2006, pp. 1-13.
Harris, et al.: "*Experimental Demonstration of a Robust and Scalable Flux Qubit*"; Physical Review B 81, 134510 (2010); DOI: 10.1103/PhysRevB.81.134510; found online at http://arxiv.org/pdf/0909.4321.pdf, submitted Sep. 24, 2009, pp. 1-20.
Paauw, et al.: "*Tuning the Gap of a Superconducting Flux Qubit*"; Phys. Rev. Lett. 102, 090501 (2009); DOI: 10.1103/PhysRevLett.102.090501; found online at http://arxiv.org/pdf/0812.1912.pdf, submitted Dec. 10, 2008, pp. 1-4.
Poletto, et al.: "*Coherent Oscillations in a Superconducting Tunable Flux Qubit Manipulated without Microwaves*"; New J. Phys. 11, 013009 (2009); DOI: 10.1088/1367-2630/11/1/013009; found online at http://xxx.tau.ac.il/pdf/0809.1331.pdf, submitted Sep. 8, 2008, pp. 1-5.
Steffen, et al.: "*High Coherence Hybrid Superconducting Qubit*"; found online at http://arxiv.org/pdf/1003.3054.pdf, submitted Mar. 16, 2010, pp. 1-4.
You, et al.: "*Low-Decoherence Flux Qubit*"; Phys. Rev. B 75, 140515(R) (2007); DOI: 10.1103/PhysRevB.75.140515; found online at http://arxiv.org/pdf/cond-mat/0609225.pdf?origin=publication_detail, submitted Sep. 10, 2006, last revised May 2, 2007, pp. 1-4.
Zhu, et al.: "*Coherent Operation of a Gap-Tunable Flux Qubit*"; Applied Physics Letters 97, 102503 (2010); DOI: 10.1063/1.3486472; found online at http://scitation.aip.org/content/aip/journal/apl/97/10/10.1063/1.3486472, received May 12, 2010, accepted Aug. 11, 2010, published online Sep. 9, 2010, pp. 1-3.
International Search Report for corresponding PCT/US2015/030160 dated Sep. 15, 2015.
Zhao, et al. "Charge-SQUID and Tunable Phase-slip Flux Qubit." *arXiv preprint arXiv:1303.5166* (2013).
Koch, et al. "Charge-Insensitive Qubit Design Derived from the Cooper Pair Box." *Physical Review A* 76.4 (2007): 042319.
Shimazu, et al. "Characteristics of switchable superconducting flux transformer with DC superconducting quantum interference device." *Japanese journal of applied physics* 46.4R (2007): 1478.
Poletto, et al.: "Coherent Oscillations in a Superconducting Tunable Flux Qubit Manipulated without Microwaves"; New Journal of Physics 11, (2009).

* cited by examiner

HYBRID QUANTUM CIRCUIT ASSEMBLY

TECHNICAL FIELD

This application relates generally to quantum computers, and more specifically, to a hybrid quantum circuit assembly.

BACKGROUND

A classical computer operates by processing binary bits of information that change state according to the laws of classical physics. These information bits can be modified by using simple logic gates such as AND and OR gates. The binary bits are physically created by a high or a low energy level occurring at the output of the logic gate to represent either a logical one (e.g. high voltage) or a logical zero (e.g. low voltage). A classical algorithm, such as one that multiplies two integers, can be decomposed into a long string of these simple logic gates. Like a classical computer, a quantum computer also has bits and gates. Instead of using logical ones and zeroes, a quantum bit ("qubit") uses quantum mechanics to occupy both possibilities simultaneously. This ability means that a quantum computer can solve certain problems with exponentially greater efficiency than that of a classical computer.

SUMMARY

In accordance with one example, a hybrid qubit circuit assembly is provided. A first plural set of Josephson junctions is arranged in series on a first path between two nodes of a circuit. A second plural set of Josephson junctions is arranged in parallel with one another to form a direct current superconducting quantum interference device (DC SQUID). The DC SQUID is in parallel with the first plural set of Josephson junctions. A capacitor is in parallel with each of the first plural set of Josephson junctions and the DC SQUID.

In accordance with another example, a method is provided for preparing a hybrid qubit circuit assembly in an arbitrary state. The method includes adiabatically transitioning the hybrid qubit from a Transmon regime to a flux regime via a first control flux, and rapidly transitioning a second control flux at a sweep rate through a hybridization gap associated with the flux regime. The hybrid qubit is then adiabatically transitioned from a flux regime to a Transmon regime via a first control flux.

In accordance with yet another example, a method is provided for performing a single qubit rotation with a hybrid qubit circuit assembly. The hybrid qubit is rapidly transitioned from a Transmon regime to a flux regime via a classical control, and maintained in the flux regime for a time period having a duration that is a function of a desired magnitude of the rotation. The hybrid qubit is then rapidly transitioned from the flux regime back to the Transmon regime via the classical control.

BRIEF DESCRIPTION OF THE DRAWINGS

The features, objects, and advantages of the hybrid qubit assembly will become more apparent from the detailed description set forth below when taken in conjunction with the drawings, wherein.

DETAILED DESCRIPTION

A hybrid quantum circuit assembly is capable of operating as either a flux qubit or a Transmon qubit. The circuit can be transitioned between these two functions, or operating regimes, by adjusting a classical control, such as a current driver inductively coupled to the qubit circuit assembly to provide a control flux to the circuit. The term "classical" implies that the manner of control behaves generally according to the laws of classical physics. In addition to selectively providing the advantages of both flux and Transmon qubit, the proposed assembly can be switched between the flux qubit and the Transmon qubit regimes to perform various quantum operations, including arbitrary quantum rotations.

The Transmon qubit is considered to be one of the most promising devices for a scalable quantum computing architecture because of its long coherence time. The Transmon qubit operates within a so-called circuit QED architecture, where the qubit is coupled strongly to a high Q resonator that functions simultaneously as a coupling bus, a filter, and a readout device. Unfortunately, existing Transmon qubits generally require microwave pulses to realize single-qubit gates. Flux qubits can be readily used for read-out and state preparation, but lack the long coherence time of the Transmon. The hybrid quantum circuit assembly described herein allows the Transmon qubit to realize single qubit gates, state preparation, and readout without the need for microwave pulses, and this capability opens the way to large scale integration of these hybrid qubits with local, on chip digital control circuitry.

Figure 1:
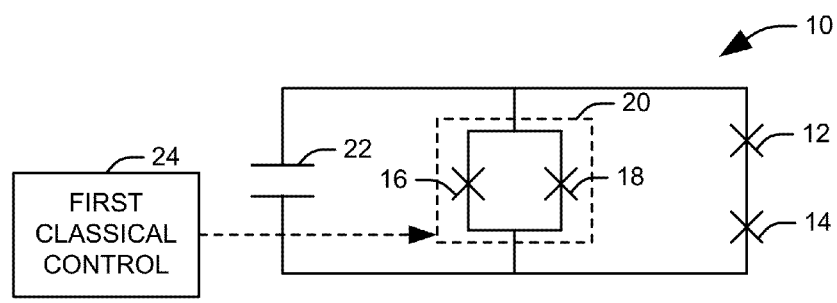
FIG. 1 illustrates a hybrid quantum circuit.

FIG. 1 illustrates a hybrid quantum circuit assembly. The illustrated hybrid quantum circuit assembly 10 includes a first plural set of Josephson junctions 12 and 14 arranged in series on a first path between two nodes of a circuit. A second plural set of Josephson junctions 16 and 18 are arranged in parallel with one another to form a direct current superconducting quantum interference device (DC SQUID) 20. The DC SQUID 20 is arranged in parallel with the first plural set of Josephson junctions. A capacitor 22 is arranged in parallel with each of the first plural set of Josephson junctions and the DC SQUID.

The hybrid quantum circuit assembly 10 is configured to transition from a flux qubit regime to a Transmon qubit regime based on a first control flux, $\Phi_{cx}$, provided by a first classical control 24 to the DC SQUID 20. In one example, the first classical control 24 can be implemented as a reciprocal quantum logic (RQL) driver providing a control current to a loop inductively coupled to the DC SQUID 20. The first control flux, $\Phi_\alpha$, controls the effective critical current of the dc SQUID, such that the effective critical current, $I_c$, can be expressed as:

$$I_c = 2I_{c1} |\cos(\pi \Phi_\alpha/\Phi_0)| \qquad \text{Eq. 1}$$

where $I_{c1}$ is a critical current of each the Josephson junctions 16 and 18 comprising the DC SQUID 20, and $\Phi_0$ is the magnetic flux quantum, approximately equal to $2.068 \times 10^{-15}$ Webers.

When $\Phi_\alpha$ is tuned such that the critical current of the DC SQUID 20 is greater than half the critical current of the first plural set of Josephson junctions 12 and 14, that is, $I_c > 0.5 * I_{c2,3}$, the qubit behaves as a flux qubit, and its basis states are the left- and right-circulating persistent current states $|L\rangle$ and $|R\rangle$. When the critical current is at this level, the potential energy of the qubit has a double-well form, with a barrier of raised energy separating the two potential wells containing the left- and right-circulating persistent current states. As $I_c$ is reduced, the height of the barrier between the left and right wells is also reduced and the $|L\rangle$ and $|R\rangle$ states hybridize as would be expected in a flux qubit. When the critical current of the dc SQUID is reduced further by the control flux, $\Phi_\alpha$, the barrier between the wells vanishes and the qubit potential becomes a single well, nonlinear oscillator. At this point, the hybrid quantum circuit assembly 10 functions as a Transmon qubit.

The hybrid quantum circuit assembly 10 uses the tunability of the potential energy barrier to move the qubit between fundamentally different operating regimes, providing a number of advantages. For example, the Transmon operating regime of the qubit can be used as a starting point for a given quantum operation, and the flux-qubit like regime can be accessed via control flux $\Phi_\alpha$ to perform single qubit rotations, state preparation, and readout. Methods for performing these functions are described in detail below in FIGS. 7-13. Accordingly, each of these functions can be performed without the use of microwave pulses, greatly enhancing the potential for large scale integration of the circuit assembly 10.

Figures 2, 3:
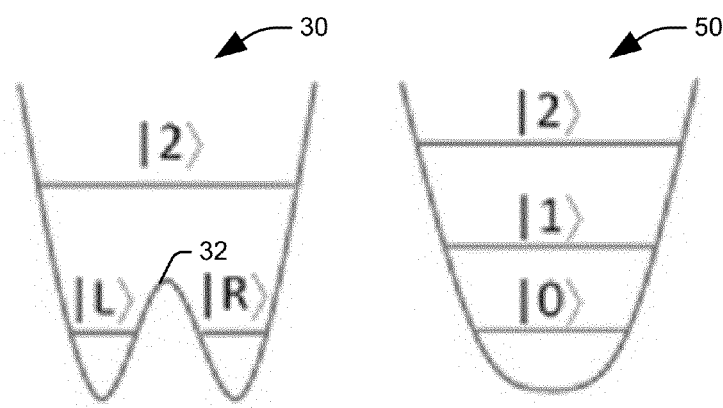
FIG. 2 illustrates an energy diagram for a hybrid quantum circuit assembly when operating in a flux qubit regime.
FIG. 3 illustrates an energy diagram for a hybrid quantum circuit assembly when operating in a Transmon qubit regime.

FIG. 2 illustrates an energy diagram 30 for the hybrid quantum circuit assembly of FIG. 1 when operating in a flux qubit regime. In such a case, the critical current of the DC SQUID 20, $I_c$, has a value greater than half of the critical current of the first plural set of Josephson junctions, that is, $I_c > 0.5 * I_{c2,3}$. In the illustrated energy diagram, it is assumed that a second control flux is at a selected value, such that an energy barrier 32 separating the energy states, $|L\rangle$ and $|R\rangle$, is positioned at a point of symmetry between the energy states. It will be appreciated, however, that an asymmetry between the left and right wells, and an associated energy difference between the energy levels is responsive to the second control flux.

FIG. 3 illustrates an energy diagram 50 for the hybrid quantum circuit assembly of FIG. 1 when operating in a Transmon qubit regime. In such a case, the critical current of the DC SQUID 20, $I_c$, has a value less than half of the critical current of the first plural set of Josephson junctions, that is, $I_c < 0.5 * I_{c2,3}$. In the Transmon qubit regime the potential is anharmonic, with few percent difference in the gaps between energy levels, that is, $(E_{21} - E_{10})/E_{01}$ ~few percent, where $E_{21}$ is the gap between the $|1\rangle$ and $|2\rangle$ energy states, and $E_{10}$ is the gap between the $|0\rangle$ and $|1\rangle$ energy states.

Figure 4:
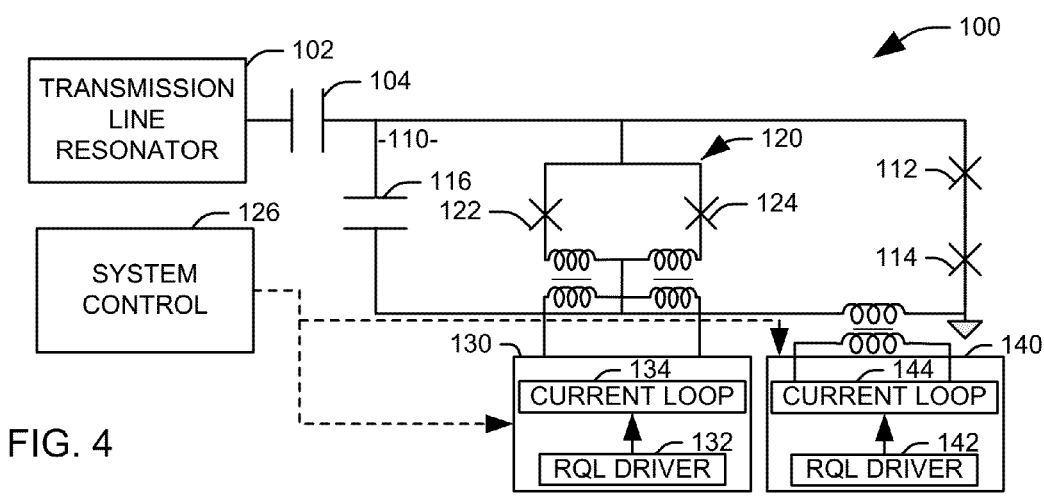
FIG. 4 illustrates one implementation of a quantum circuit.

FIG. 4 illustrates one implementation of a quantum circuit 100. The circuit 100 includes a transmission line resonator 102 coupled to a hybrid quantum circuit assembly 110 through a coupling capacitor 104. The hybrid quantum circuit assembly 110 includes three parallel paths, a first path with two Josephson junctions 112 and 114 connected in series, a second path with a shunting capacitor 116, and a third path with a DC SQUID 120. The DC SQUID 120 is formed from two Josephson junctions 122 and 124 connected in parallel.

A system control 126 is operatively connected to a first classical control 130 and a second classical control 140, such that the system control can control respective magnitudes of the first and second control fluxes. The system control 126 can be implemented, for example, as dedicated hardware, software or firmware executed on a general purpose computer, or some combination of software and dedicated hardware. The first classical control 130 is configured to control a depth of the potential energy wells, or rather, the height of the barrier separating them, associated with the $|L\rangle$ and $|R\rangle$ states by providing a first control flux, $\Phi_\alpha$, to the DC SQUID 120. The barrier between the states can be tuned to a negligible height to allow the system to operate as a Transmon qubit. The first classical control 130 includes a first RQL driver 132 and a first current loop 134 inductively coupled to the DC SQUID 120. The second classical control 140 is configured to control the symmetry of the qubit potential by providing a second control flux, $\Phi_A$, to the circuit. The second classical control 140 includes a first RQL driver 142 and a current loop 144 inductively coupled to the hybrid quantum circuit assembly 110.

Figure 5:
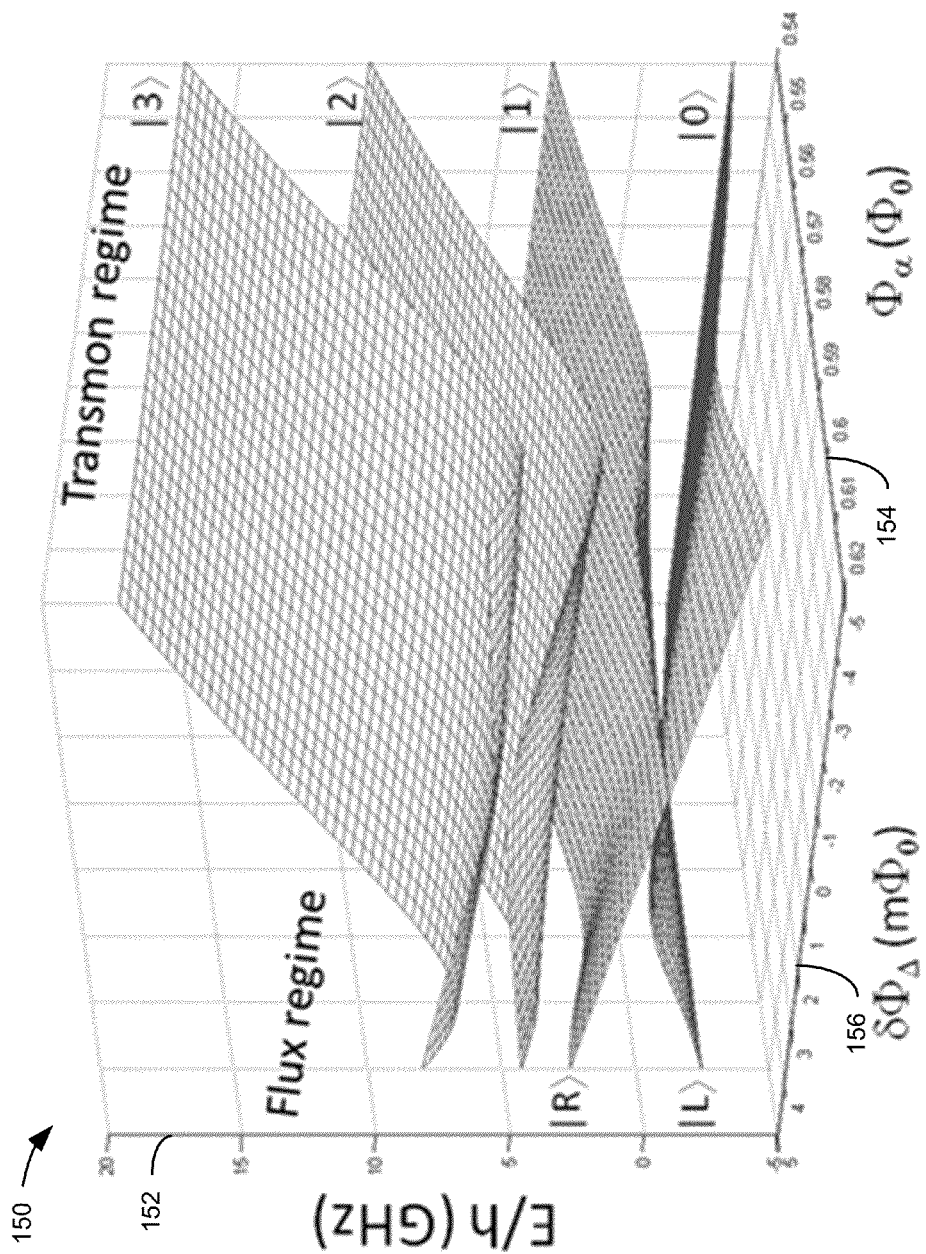
FIG. 5 illustrates an energy diagram for the hybrid quantum circuit assembly of FIG. 4.

FIG. 5 illustrates an energy diagram 150 for the hybrid quantum circuit assembly of FIG. 4. As an example, the energy diagram assumes that all of the critical currents of the Josephson junctions is the same, such that $I_{c1} = I_{c2} = I_{c3} = 100$ nA, and the shunt capacitance is 100 fF. In the figure, the vertical axis 152 is a frequency of the hybrid quantum circuit assembly, a first horizontal axis 154 represents a value of the first classical control, $\Phi_\alpha$, in units of the magnetic flux quantum, $\Phi_0$, and a second horizontal axis 156 represents a value of a deviation of the second classical control, $\Phi_A$, from a symmetry point (represented as 0 in the chart) in microunits of the magnetic flux quantum, $\Phi_0$.

For $\Phi_\alpha > 0.5\,\Phi_0$, the energy degeneracy of $|L\rangle$ and $|R\rangle$ occurs at $\Phi_A = 0$, and for $\Phi_\alpha < 0.5\,\Phi_0$, the energy degeneracy of $|L\rangle$ and $|R\rangle$ occurs at $\Phi_A = 0.5$. For $\Phi_\alpha < 0.58\,\Phi_0$, the energy levels become nearly independent of $\Phi_A$. This regime corresponds to the qubit potential having the form of FIG. 3, such that the qubit behaves as a Transmon qubit with states like those of a nonlinear quantum oscillator. For $\Phi_\alpha > 0.58\,\Phi_0$, the qubit potential takes the shape of FIG. 2, with a non-vanishing barrier between two local potential wells. In this regime, the states of the qubit are composed of well-defined left- and right-circulating current states, and the qubit behaves as a flux qubit. As in the usual flux qubit, at $\delta\Phi_A = 0$ the states $|L\rangle$ and $|R\rangle$ hybridize by tunneling through the inter-well barrier, so that at this point the states $|0\rangle$ and $|1\rangle$ can be viewed as bonding and anti-bonding orbitals composed of $|L\rangle$ and $|R\rangle$, with a hybridization gap that depends on the height of the barrier. In the Transmon regime, the qubit remains anharmonic, with gaps between energy states differing by a few percent. The anharmonicity can be increased by reducing the value of the capacitor shunting the junctions.

Figure 6:
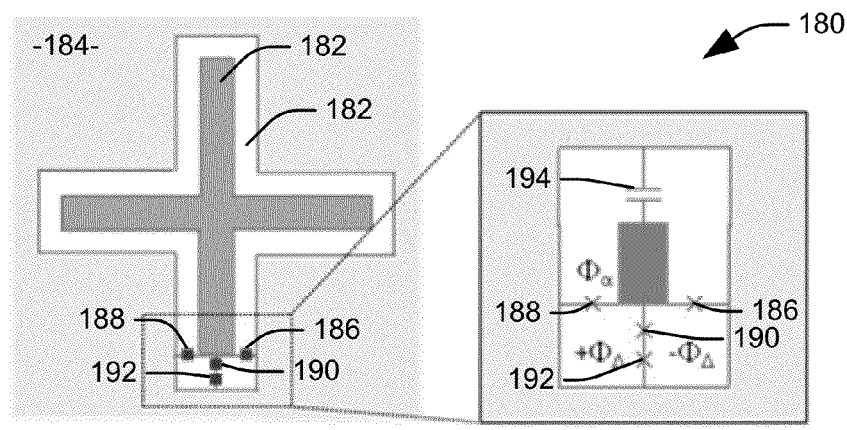
FIG. 6 illustrates one implementation of a hybrid quantum circuit assembly.

FIG. 6 illustrates one implementation of a hybrid quantum circuit assembly 180. The illustrated implementation 180 represents a planar implementation based upon an Xmon qubit geometry. The Xmon geometry includes a superconducting film 182 patterned as two perpendicular strips intersecting at respective midpoints. For example, the superconductive film 182 can be implemented as an aluminum film patterned on top of an insulator substrate 183, such that the superconductive film is separated from an associated ground plane 184 by the insulator region. In one implementation, each strip of the superconducting film 182 can be on the order of three hundred micrometers long and on the order of ten micrometers wide.

At one end of the superconductive film 182, first and second Josephson junctions 186 and 188 are provided in parallel to either side of the first superconductive film 182 to form a DC SQUID. Third and fourth Josephson junctions 190 and 192 are arranged collinearly with a midline of the first superconductive film 182. The superconductive film 182 forms an interdigitated capacitor 194 between superconducting film 182 and ground plane 184. The first control flux, $\Phi_\alpha$, is applied in the common mode of the loop defined by borders of the ground plane and junctions 186 and 188. The second control flux, $\Phi_\Delta$, is applied to one of the loops formed by a trace containing the third and fourth Josephson junctions 190 and 192. In this implementation, a positive adjustment to the flux, relative to the symmetry point, is provided by applying the flux to one loop, and a negative flux is provided by providing the flux to the other loop. This arrangement ensures that the two control fluxes can be applied independently from each other with minimal cross-talk.

Throughout the foregoing disclosure, various methods for creating quantum logic gates are implied. The following embodiments are provided to expressly illustrate methods for implementing quantum logic operations with the hybrid qubit assembly. These methods may be embodied, in whole or in part, as processing steps stored in a classical computer memory and executable by a classical computer processor for manipulating a hybrid quantum circuit.

Figure 7:
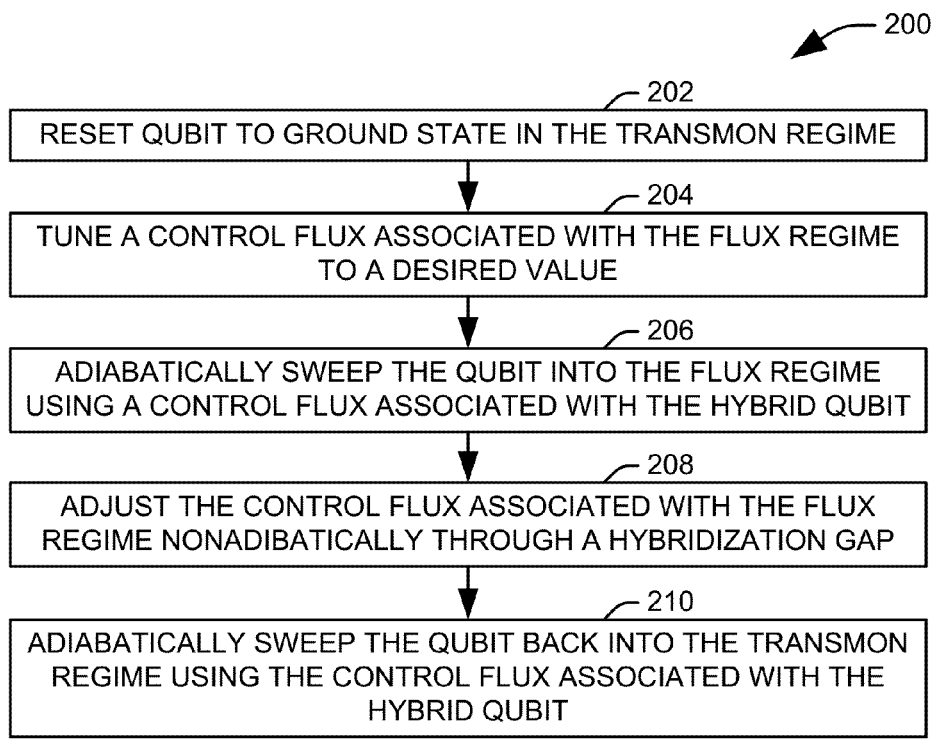
FIG. 7 illustrates a method for preparing an arbitrary state in a Transmon regime of a hybrid qubit circuit assembly.
Figures 8, 9:
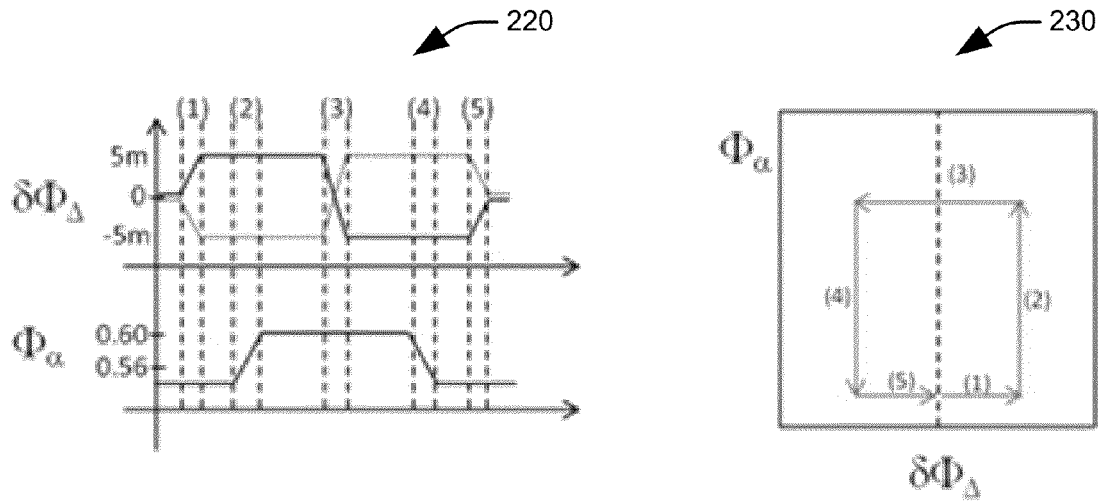
FIG. 8 illustrates an exemplary pulse diagram representing one example implementation of the method of FIG. 7.
FIG. 9 illustrates an energy diagram representing an example implementation of the method of FIG. 7.

FIG. 7 illustrates a method 200 for preparing an arbitrary state in a Transmon regime of a hybrid qubit circuit assembly. The method utilizes a first control flux associated with the hybrid qubit circuit assembly, $\Phi_\alpha$, to transition between the flux and Transmon regimes, and a second control flux associated with the flux regime, $\delta\Phi_\Delta$, is used to tune an asymmetry between the left and right wells, and associated energy difference between the $|L\rangle$ and $|R\rangle$ energy levels. FIG. 8 illustrates an exemplary pulse diagram 220 representing one example implementation of the method. FIG. 9 illustrates an energy diagram 230 representing the example implementation of the method. The method begins with the hybrid qubit tuned to the Transmon regime with the second control flux set to zero. At 202, the qubit is reset to its ground state. At 204, the second control flux is tuned to a desired value, representing a finite detuning. The desired value can be selected according to a desired population of energy states in the Transmon qubit. This operation is denoted as (1) in FIGS. 8 and 9. At 206, the first control flux is adiabatically swept into the flux qubit regime. This operation is denoted as (2) in FIGS. 8 and 9. Like the detuning of the second control value, the specific end value for the first control flux can be selected according to the desired population of energy states.

At 208, the second control flux is adjusted nonadiabatically, such that the qubit is swept through the hybridization gap at $\delta\Phi_\Delta=0$, where both the $|L\rangle$ and $|R\rangle$ states become populated due to Landau-Zener tunneling with weights that depend on the ratio of the sweep rate to the gap energy. This operation is denoted as (3) in FIGS. 8 and 9. The value of the first control flux during 208 determines the hybridization gap energy, which in turn determines the Landau-Zener tunneling probability and the final weights in the superposition state of the Transmon qubit. At 210, the first control flux is returned to its original value to return the hybrid qubit into the Transmon regime, which is denoted as (4) in FIGS. 8 and 9. After this step, the populations in the $|L\rangle$ and $|R\rangle$ states are mapped into the Transmon $|0\rangle$ and $|1\rangle$ states. The second control flux can then be tuned to its original value, denoted as (5) in FIGS. 8 and 9.

Figure 10:
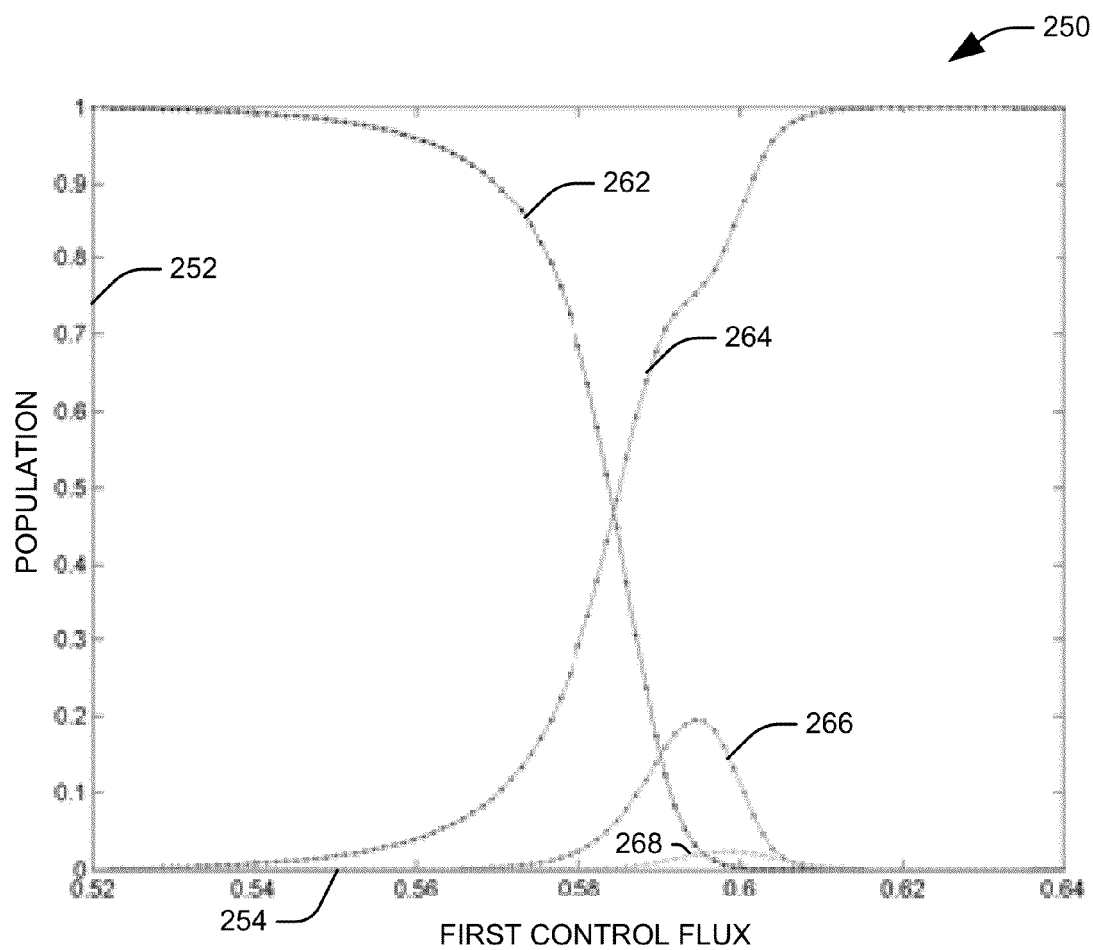
FIG. 10 is a chart illustrating a population of each of a plurality of energy states of the Transmon qubit as a function of a value of the first control flux during the method of FIG. 7.

FIG. 10 is a chart 250 illustrating a population, represented by a vertical axis 252, of each of a plurality of energy states of the Transmon qubit after the method of FIG. 7 as a function of a value of the first control flux after the transition of 206, represented as units of the magnetic flux quantum. A first line 262 represents a ground state of the Transmon regime, a second line 264 represents a first excited state, a third line 266 represents a second excited state, and a fourth line 268 represents a third excited state. As can be seen from the chart, the population of the states in the computational basis, that is, the ground and first excited states, can be controlled via the value of the first control flux to prepare the Transmon qubit in a arbitrary state. Leakage from the computational basis into the second and third excited states is at most twenty percent, and can be minimized by reducing the slew rate of the second control flux in 208 or by optimizing the trajectory in the $\Phi_\Delta$-$\Phi_\alpha$ plane.

Figure 11:
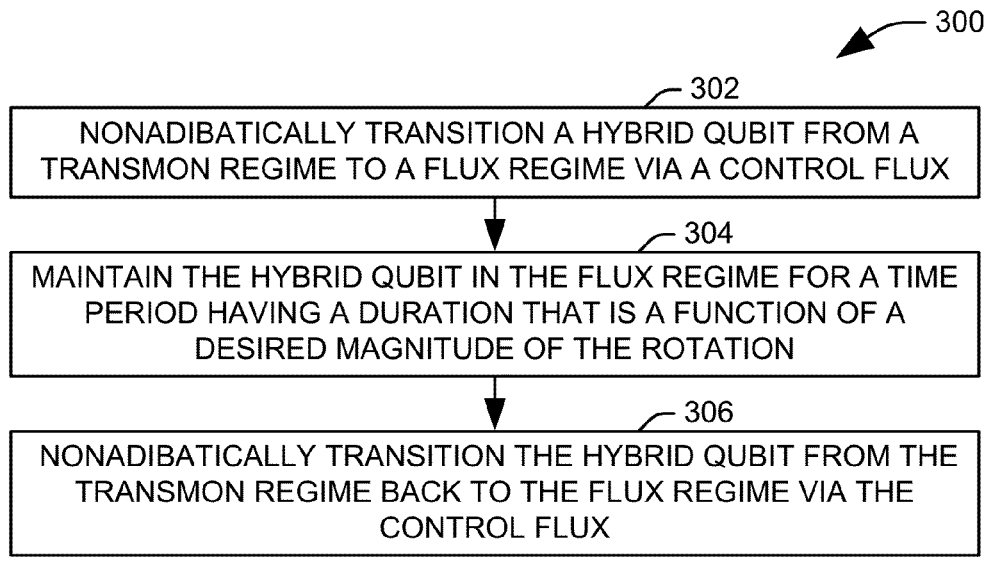
FIG. 11 illustrates a method for performing a single qubit rotation with a hybrid qubit circuit assembly.
Figures 12, 13:
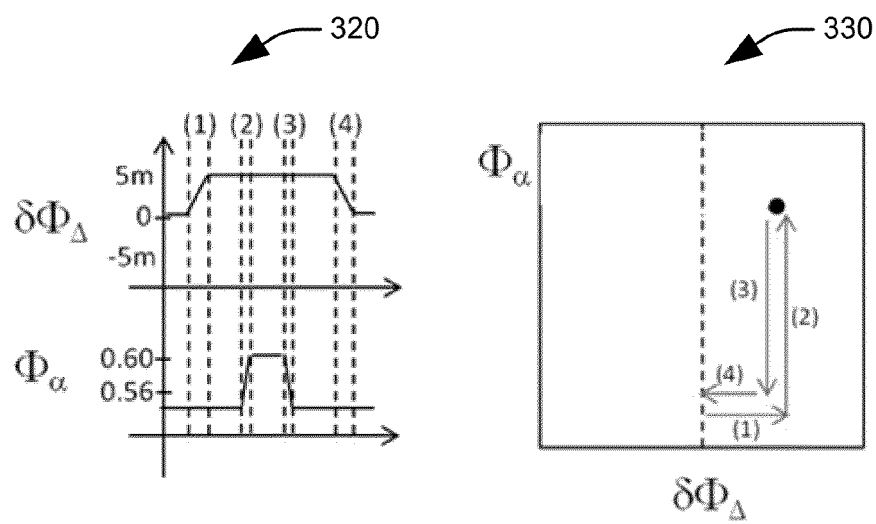
FIG. 12 illustrates an exemplary pulse diagram representing one example implementation of the method of FIG. 11.
FIG. 13 illustrates an energy diagram representing an example implementation of the method of FIG. 11.

FIG. 11 illustrates a method 300 for performing a single qubit rotation with a hybrid qubit circuit assembly. The method utilizes a first control flux associated with the hybrid qubit circuit assembly, $\Phi_\alpha$, to transition between the flux and Transmon regimes, and a second control flux associated with the flux regime, $\delta\Phi_\Delta$, is used to tune a barrier between the $|L\rangle$ and $|R\rangle$ energy states. FIG. 12 illustrates an exemplary pulse diagram 320 representing one example implementation of the method. FIG. 13 illustrates an energy diagram 330 representing the example implementation of the method. The Hamiltonian of the qubit in the Transmon regime, written in the $\{|0\rangle, |1\rangle\}$ basis of the Transmon, is given by $H=\epsilon(\Phi_\alpha)\sigma_Z$, where $\epsilon(\Phi_\alpha)$ is the level spacing and $\sigma_Z$ is the Pauli operator. When the qubit is tuned into the flux regime, its Hamiltonian changes to $H=\epsilon(\Phi_\alpha)\sigma_Z+\Delta(\Phi_\Delta)\sigma_X$ and has eigenstates along a quantization axis that is tilted from that of the Transmon. The orientation of the quantization axis depends on both the values selected for first and second control values during the rotation. When the qubit is rapidly swept from an initial state in the Transmon regime to a point $(\Phi_\alpha, \delta\Phi_\Delta)$ in the flux regime, the original state of the qubit, $a|0\rangle+b|1\rangle$, will begin to precess about the new quantization axis. A single qubit rotation can then be realized by a fast sweep to the point that defines a desired rotation axis, waiting at that point for a prescribed period of free evolution during which the qubit precesses, and then rapidly sweeping the qubit back to the Transmon regime.

Prior to beginning the method 300, the qubit is in the Transmon regime. A value for the second control flux can be selected according to a desired axis of the single qubit rotation, and the second control flux can be tuned to that value, represented in FIGS. 12 and 13 as (1). At 302, the hybrid qubit is rapidly (i.e. nonadiabatically) transitioned from a Transmon regime to a flux regime via a first control flux. For example, a classical control mechanism can be transitioned at a rate that is "fast" compared to a frequency of the system, as opposed to an adiabatic transition, which is slow compared to a frequency of the system. This is denoted in FIGS. 12 and 13 as (2). At 304, the hybrid qubit is maintained in the flux regime for a time period having a duration that is a function of a desired magnitude of the rotation. During this time, the qubit state precesses around an axis of rotation until a desired magnitude of the rotation is achieved. In one implementation, the axis of rotation is determined from values of the first control flux and a second control flux controlling a symmetry of an energy barrier in the flux regime. At 306, the qubit is rapidly transitioning the hybrid qubit from the flux regime back to the Transmon regime. This transition is denoted in FIGS. 12 and 13 as (3). The second control value can then be returned to an original value, which is represented in FIGS. 12 and 13 as (4).

The invention has been disclosed illustratively. Accordingly, the terminology employed throughout the disclosure should be read in an exemplary rather than a limiting manner. Although minor modifications of the invention will occur to those well versed in the art, it shall be understood that what is intended to be circumscribed within the scope of the patent warranted hereon are all such embodiments that reasonably fall within the scope of the advancement to the art hereby contributed, and that that scope shall not be restricted.

Having described the invention, we claim:

1. A hybrid qubit circuit assembly comprising:
   a first plural set of Josephson junctions arranged in series on a first path between two nodes of a circuit; and
   a second plural set of Josephson junctions arranged in parallel with one another to form a direct current superconducting quantum interference device (DC SQUID), the DC SQUID being in parallel with the first plural set of Josephson junctions;
   wherein the hybrid qubit circuit assembly is responsive to a flux provided to the DC SQUID as to transition between a first operating regime, in which the hybrid qubit circuit assembly behaves as a flux qubit, and a second operating regime, in which the hybrid qubit circuit assembly behaves as a Transmon qubit.

2. The hybrid qubit circuit assembly of claim 1, the DC SQUID comprising at least one inductor, such that a bias current within the DC SQUID can be provided inductively in response to a flux provided from an associated control circuit, such that a critical current of the DC SQUID is a function of the provided flux.

3. The hybrid qubit circuit assembly of claim 2, wherein the qubit circuit assembly is configured to operate as a flux qubit when the critical current of the DC SQUID is above a threshold value and to operate as a Transmon qubit when the critical current of the DC SQUID is below a threshold value, such that the operation of the qubit circuit assembly is selectable via the control circuit associated with the DC SQUID.

4. The hybrid qubit circuit assembly of claim 3, wherein the threshold value for the critical current is a function of the critical currents of the first plural set of Josephson junctions.

5. The hybrid qubit circuit assembly of claim 1, further comprising a capacitor implemented in parallel with each of the first plural set of Josephson junctions and the DC SQUID.

6. A system comprising:
   the hybrid qubit circuit assembly of claim 5; and
   a classical control configured to provide the flux to the DC SQUID.

7. The system of claim 6, further comprising a transmission line resonator coupled to the hybrid quantum circuit assembly.

8. The system of claim 6, wherein the classical control comprises an RQL driver providing current to current loop inductively coupled to the DC SQUID.

9. The system of claim 6, wherein the classical control is a first classical control and the flux is a first flux, the system further comprising a second classical control configured to provide a second flux to the hybrid qubit circuit assembly.

10. The system of claim 9, further comprising a system control operatively connected to each of the first classical control and the second classical control, the system control being operative to control respective magnitudes of the first flux and the second flux.

11. The system of claim 10, wherein the system control is configured to adiabatically transition the hybrid qubit from a Transmon regime to a flux regime via the first control flux, rapidly transition the second control flux at a sweep rate through a hybridization gap associated with the flux regime and adiabatically transition the hybrid qubit from a Transmon regime to a flux regime via a first control flux.

12. The system of claim 11, wherein the system control is configured to transition the magnitude of the second flux from a starting value associated with a symmetry point to a first value on a first side of the symmetry point, adiabatically transition the magnitude of the first flux from a second value, associated with the Transmon regime to a third value associated with the flux regime, rapidly transition the magnitude of the second flux from the first value to a fourth value on a second side of the symmetry point, adiabatically transition the magnitude of the first flux back to the second value, and transition the magnitude of the second flux back to the starting value.

13. The system of claim 11, wherein the system control is configured to select the hybridization gap according to a desired population of a plurality of energy states in the Transmon regime, the population of each energy states being a function of a ratio of the sweep rate to an energy of the hybridization gap.

14. The system of claim 10, wherein the system control is configured to rapidly transition the hybrid qubit from a Transmon regime to a flux regime, maintain the hybrid in the flux regime for a time period having a duration that is a function of a desired magnitude of the rotation, and rapidly transitioning the hybrid qubit from the flux regime back to the Transmon regime.

15. The system of claim 13, wherein the system control is configured to transition the magnitude of the second flux from a starting value associated with a symmetry point to a first value associated with an axis of rotation for a qubit location, rapidly transition the magnitude of the first flux from a second value, associated with the Transmon regime to a third value associated with the flux regime, maintain the magnitude of the first flux at the third value for a for a time period having a duration that is a function of a desired magnitude of the rotation, rapidly transition the magnitude of the first flux back to the second value, and transition the magnitude of the second flux back to the starting value.

16. The system of claim 14, wherein the system control is configured to select at least one desired value of the first classical control and at least one desired value of the second classical control according to at least one desired axis of rotation for a single qubit rotation.

17. A method for preparing a hybrid qubit circuit assembly in an arbitrary state, the method comprising:
   adiabatically transitioning the hybrid qubit from a Transmon regime to a flux regime via a first control flux;
   rapidly transitioning a second control flux at a sweep rate through a hybridization gap associated with the flux regime; and
   adiabatically transitioning the hybrid qubit from the flux regime to the Transmon regime via the first control flux.

18. The method of claim 17, further comprising selecting the hybridization gap according to a desired population of a plurality of energy states in the Transmon regime.

19. The method of claim 17, wherein rapidly transitioning the hybrid qubit from a Transmon regime to a flux regime via the first classical control comprises transitioning the first classical control to a desired value, the method further comprising selecting the desired value according to a desired energy of the hybridization gap.

20. A method for performing a single qubit rotation with a hybrid qubit circuit assembly, the method comprising:
- rapidly transitioning the hybrid qubit from a Transmon regime to a flux regime via a classical control, such that the Hamiltonian, H, of the hybrid qubit changes to $H = \epsilon(\Phi_\alpha)\sigma_Z + \Delta(\Phi_\Delta)\sigma_X$, where $\epsilon(\Phi_\alpha)$ is the level spacing in the Transmon regime, $\sigma_x$ and $\sigma_Z$ are Pauli operators, and $\Delta(\Phi_\Delta)$ is a function of a control flux, $\Phi_\Delta$, used to tune the asymmetry of the flux qubit, with eigenstates along a quantization axis that is tilted relative to a quantization axis of the Transmon;
- maintaining the hybrid qubit in the flux regime for a time period having a duration that is a function of a desired magnitude of the rotation around the quantization axis; and
- rapidly transitioning the hybrid qubit from the flux regime back to the Transmon regime via the classical control.

21. The method of claim 20, wherein the classical control is a first classical control, the method further comprising setting a second classical control to a desired value before rapidly transitioning the hybrid qubit from a Transmon regime to a flux regime via the first classical control.

22. The method of claim 20, wherein rapidly transitioning the hybrid qubit from a Transmon regime to a flux regime via the first classical control comprises transitioning the first classical control to a desired value, the method further comprising selecting the desired value of the first classical control and the desired value of the second classical control according to a desired axis of rotation for the single qubit rotation.

\* \* \* \* \*